US012696636B2

(12) United States Patent (10) Patent No.: US 12,696,636 B2
Park et al. (45) Date of Patent: Jul. 28, 2026

(54) ARRAY SUBSTRATE FOR DISPLAY APPARATUS AND METHOD OF MANUFACTURING DISPLAY APPARATUS

(71) Applicant: Samsung Display Co., Ltd., Yongin-si (KR)

(72) Inventors: Jongseon Park, Yongin-si (KR); Wonkyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 627 days.

(21) Appl. No.: 18/152,713

(22) Filed: Jan. 10, 2023

(65) Prior Publication Data

US 2023/0292563 A1 Sep. 14, 2023

(30) Foreign Application Priority Data

Mar. 8, 2022 (KR) ......................... 10-2022-0029465

(51) Int. Cl.
H10K 59/131 (2023.01)
H10K 59/12 (2023.01)
(Continued)

(52) U.S. Cl.
CPC ....... H10K 59/131 (2023.02); H10K 59/1201 (2023.02); H10K 59/1213 (2023.02);
(Continued)

(58) Field of Classification Search
CPC ............. H10K 59/131; H10K 59/1201; H10K 59/1213; H10K 59/1216; H10K 59/873;
(Continued)

(56) References Cited

U.S. PATENT DOCUMENTS

| 2002/0145116 | A1* | 10/2002 | Choo | H10F 39/011 |
| | | | | 257/E27.113 |
| 2005/0145855 | A1* | 7/2005 | Park | H10D 86/60 |
| | | | | 438/22 |

(Continued)

FOREIGN PATENT DOCUMENTS

| CN | 110350103 A | * 10/2019 | ............. H10K 50/86 |
| JP | 2017-146450 A | 8/2017 | |

(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

In an array substrate for a display apparatus, the array substrate includes: a mother substrate; a base substrate on the mother substrate and comprising a display cell and a peripheral area surrounding the display cell, the display cell comprising a display area and a non-display area surrounding the display area; a ground pad at an edge of the base substrate and extending from an upper surface of the base substrate to an upper surface of the mother substrate; a ground wire in the peripheral area to surround the display cell and electrically connected to the ground pad and the display cell; a first organic layer covering an edge of the ground pad; and a second organic layer on the first organic layer and covering the ground pad.

20 Claims, 15 Drawing Sheets

(51) Int. Cl.
    *H10K 59/121*        (2023.01)
    *H10K 59/80*         (2023.01)
    *H10K 71/00*         (2023.01)

(52) U.S. Cl.
    CPC ....... *H10K 59/1216* (2023.02); *H10K 59/873*
            (2023.02); *H10K 71/00* (2023.02)

(58) Field of Classification Search
    CPC .... H10K 71/00; H10K 77/10; H10K 50/8423;
            H10K 50/844; H10K 59/124; H10K
            59/40; H10K 59/12; H10K 71/40; H10K
            71/421; H10K 71/441; H10K 59/00;
            H10K 50/00; H10D 86/021–0251; H10D
                          86/40–60
    See application file for complete search history.

(56)               References Cited

U.S. PATENT DOCUMENTS

2010/0165226 A1*  7/2010  Lee ................... G02F 1/133351
                                  349/40
2014/0001966 A1    1/2014  Cho

2014/0097430 A1*  4/2014  Park .................... H10D 86/411
                                 257/48
2016/0351852 A1* 12/2016  Kim ................. H10K 59/8731
2017/0031191 A1*  2/2017  Choi ...................... H10P 54/00
2019/0304921 A1* 10/2019  Kuroe .................. G02F 1/1333
2020/0176709 A1*  6/2020  Moon .................. G06F 3/0443
2020/0219952 A1    7/2020  Kim et al.
2020/0287139 A1*  9/2020  Cheng ................. H10K 71/164
2021/0335986 A1  10/2021  Jeon et al.
2022/0020838 A1    1/2022  You
2022/0030711 A1    1/2022  Lee et al.
2022/0107526 A1    4/2022  Abe et al.
2022/0260879 A1*  8/2022  Ishikawa .......... G02F 1/136204
2022/0276735 A1*  9/2022  Pu ........................ G06F 3/0445

FOREIGN PATENT DOCUMENTS

KR    10-2014-0004360 A    1/2014
KR    10-2014-0012487 A    2/2014
KR    10-2017-0115149 A  10/2017
KR    10-2021-0131508 A  11/2021
KR    10-2022-0010692 A    1/2022
KR    10-2022-0014439 A    2/2022

* cited by examiner

FIG. 11

ARRAY SUBSTRATE FOR DISPLAY APPARATUS AND METHOD OF MANUFACTURING DISPLAY APPARATUS

CROSS-REFERENCE TO RELATED APPLICATION

The present application claims priority to and the benefit of Korean Patent Application No. 10-2022-0029465, filed on Mar. 8, 2022, in the Korean Intellectual Property Office, the entire content of which is hereby incorporated by reference.

BACKGROUND

1. Field

Aspects of one or more embodiments relate to an array substrate for a display apparatus and a method of manufacturing a display apparatus.

2. Description of the Related Art

In general, a display apparatus includes a display element and electronic devices configured to control an electrical signal applied to the display element. The electronic devices include a thin-film transistor (TFT), a storage capacitor, and a plurality of wires.

For process convenience, a display apparatus is manufactured by forming an array substrate for a display apparatus on a mother substrate, the array substrate including a plurality of display cells, and separating the plurality of display cells through a scribing process, followed by performing a subsequent process such as module attachment on each of the separated display cells.

The above information disclosed in this Background section is only for enhancement of understanding of the background and therefore the information discussed in this Background section does not necessarily constitute prior art.

SUMMARY

Aspects of one or more embodiments relate to an array substrate for a display apparatus and a method of manufacturing a display apparatus, and for example, to an array substrate for a display apparatus capable of displaying a high-quality image and a method of manufacturing a display apparatus.

However, in an array substrate for a display apparatus and a method of manufacturing a display apparatus according to the related art, pixel defects may occur due to static electricity charged in a process using a fine metal mask.

One or more embodiments include an array substrate for a display apparatus in which occurrence of pixel defects due to static electricity is reduced and a method of manufacturing a display apparatus using the array substrate. However, such an objective is merely an example, and the scope of embodiments according to the present disclosure are not limited thereto.

Additional aspects will be set forth in part in the description which follows and, in part, will be apparent from the description, or may be learned by practice of the presented embodiments of the disclosure.

According to one or more embodiments, an array substrate for a display apparatus includes a mother substrate, a base substrate on the mother substrate and including a display cell and a peripheral area surrounding the display cell, the display cell including a display area and a non-display area surrounding the display area, a ground pad arranged at an edge of the base substrate and extending from an upper surface of the base substrate to an upper surface of the mother substrate, a ground wire arranged in the peripheral area to surround the display cell and electrically connected to the ground pad and the cell, a first organic layer covering an edge of the ground pad, and a second organic layer on the first organic layer and covering the ground pad.

According to some embodiments, the display cell may include a terminal portion arranged on one side of the non-display area, and the terminal portion may be electrically connected to the ground pad through the ground wire.

According to some embodiments, the display cell may include a pixel circuit including a thin-film transistor and a storage capacitor, a display element arranged in the display area and electrically connected to the pixel circuit, and a planarization insulating layer arranged between the pixel circuit and the display element, and the first organic layer may include a same material as the planarization insulating layer.

According to some embodiments, the display cell may include an encapsulation layer on the display element and including at least one inorganic encapsulation layer and an organic encapsulation layer, and the second organic layer may include a same material as the organic encapsulation layer.

According to some embodiments, the array substrate may further include a metal layer covering the second organic layer.

According to some embodiments, the display cell may include an input sensing layer arranged in the display area, the input sensing layer may include a first conductive layer, a second conductive layer, and an insulating layer arranged between the first conductive layer and the second conductive layer, and the metal layer may include a same material as the first conductive layer or the second conductive layer.

According to some embodiments, the array substrate may further include a cover layer overlapping the ground wire.

According to some embodiments, a portion of the ground wire may be arranged in the non-display area.

According to some embodiments, the array substrate may further include an inorganic insulating layer extending from the base substrate to the mother substrate, wherein the inorganic insulating layer may be in direct contact with the mother substrate.

According to some embodiments, the ground pad may be on the inorganic insulating layer.

According to some embodiments, the display cell may include a pixel circuit including a thin-film transistor and a storage capacitor, a display element arranged in the display area and electrically connected to the pixel circuit, and a contact metal connecting the pixel circuit to the display element, and the ground pad may include a same material as the contact metal.

According to one or more embodiments, a method of manufacturing a display apparatus includes forming, on a mother substrate, a base substrate including a display cell and a peripheral area surrounding the display cell, the display cell including a display area and a non-display area surrounding the display area, forming a pixel circuit including a thin-film transistor and a storage capacitor on the base substrate, forming a ground pad and a ground wire, the ground pad being arranged at an edge of the base substrate, and the ground wire electrically connecting the ground pad to the pixel circuit, forming a first organic layer and a cover layer, the first organic layer covering an edge of the ground pad, and the cover layer covering the ground wire, forming a display element electrically connected to the pixel circuit in the display area, forming a second organic layer to cover the ground pad, and separating the display cell from the peripheral area along an edge of the display cell.

According to some embodiments, the forming of the display element may include forming a pixel electrode, forming an emission layer, and forming an opposite electrode, wherein, in the forming of the emission layer, the ground pad may be in direct contact with a holder of deposition equipment.

According to some embodiments, the forming of the first organic layer may include forming a planarization insulating layer on the pixel circuit.

According to some embodiments, the method may further include forming an inorganic encapsulation layer covering the display element between the forming of the display element and the forming of the second organic layer, wherein the forming of the second organic layer may include forming an organic encapsulation layer on the inorganic encapsulation layer.

According to some embodiments, the method may further include forming a metal layer covering the second organic layer after the forming of the second organic layer.

According to some embodiments, the display cell may include an input sensing layer arranged in the display area, the input sensing layer may include a first conductive layer, a second conductive layer, and an insulating layer arranged between the first conductive layer and the second conductive layer, and the first conductive layer may be formed in the forming of the metal layer.

According to some embodiments, the display cell may include an input sensing layer arranged in the display area, the input sensing layer may include a first conductive layer, a second conductive layer, and an insulating layer arranged between the first conductive layer and the second conductive layer, and the second conductive layer may be formed in the forming of the metal layer.

According to some embodiments, the display cell may include a terminal portion arranged on one side of the non-display area, and the terminal portion may be electrically connected to the ground pad through the ground wire.

According to some embodiments, in the separating of the display cell from the peripheral area, a portion of the ground wire may remain in the display cell.

Other aspects, features, and characteristics than those described above will become apparent from the following drawings, the claims, and the detailed description.

BRIEF DESCRIPTION OF THE DRAWINGS

The above and other aspects, features, and characteristics of certain embodiments of the disclosure will be more apparent from the following description taken in conjunction with the accompanying drawings, in which:

FIGS. 9 to 12 are cross-sectional views illustrating a method of manufacturing a display apparatus in stages, according to an embodiment;

DETAILED DESCRIPTION

Figure 1:
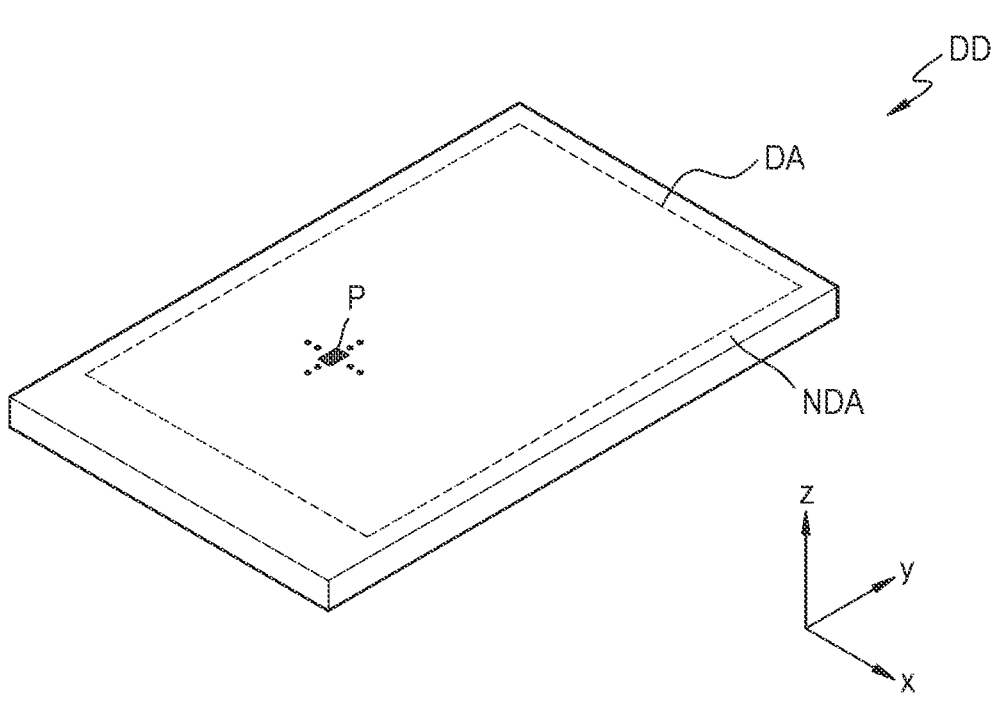
FIG. 1 is a perspective view schematically illustrating a display apparatus manufactured according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in detail in the written description. Effects and features of the present disclosure, and methods of achieving them, will become apparent with reference to the embodiments described below in detail in conjunction with the drawings. However, the present disclosure is not limited to the embodiments disclosed below, and may be implemented in various forms.

Hereinafter, embodiments of the present disclosure will be described in detail with reference to the accompanying drawings. When describing the present disclosure with reference to the drawings, the same or corresponding components are given the same reference numerals, and overlapping descriptions thereof will be omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be understood that the terms "comprise," "comprising," "include", and/or "including" as used herein specify the presence of stated features or components but do not preclude the addition of one or more other features or components.

It will be understood that when a layer, region, or component is referred to as being "on" another layer, region, or element, it may be "directly on" the other layer, region, or component and/or may be "indirectly on" the other layer, region, or component with one or more intervening layers, regions, or components therebetween.

It will be understood that when a layer, region, or component is referred to as being "connected" to another layer, region, or component, it may be "directly connected" to the other layer, region, or component and/or may be "indirectly connected" to the other layer, region, or component with one or more intervening layers, regions, or components therebetween. For example, when a layer, region, or component is referred to as being "electrically connected" to another layer, region, or component, it may be "directly electrically connected" to the other layer, region, or component and/or may be "indirectly electrically connected" to the other layer, region, or component with one or more intervening layers, regions, or components therebetween.

As used herein, "A and/or B" refers to A, B, or A and B. In addition, "at least one of A and B" refers to A, B, or A and B.

As used herein, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two processes described in succession may be performed substantially simultaneously, or may be performed in an order opposite to the order described.

In the drawings, sizes of components may be exaggerated or reduced for convenience of description. For example, because sizes and thicknesses of components in the drawings are arbitrarily illustrated for convenience of description, the present disclosure is not limited thereto.

FIG. 1 is a perspective view schematically illustrating a display apparatus DD manufactured according to some embodiments.

Referring to FIG. 1, the display apparatus DD includes a display area DA that implements or displays images and a non-display area NDA where images are not displayed. The display apparatus DD may display images by using light emitted at the display area DA.

The display area DA may have a rectangular shape as shown in FIG. 1, but embodiments according to the present disclosure are not limited thereto. The display area DA may have a generally rectangular shape, a generally circular shape, a generally oval shape, or a polygonal shape. In some embodiments, the display area DA may have rounded corners, for example. The non-display area NDA may surround at least a portion of the display area DA.

The display apparatus DD may be a flat panel display apparatus as shown in FIG. 1, but embodiments according to the present disclosure are not limited thereto. The display apparatus DD may be implemented in various forms, such as flexible, foldable, and rollable display apparatuses.

According to some embodiments, the display apparatus DD may include a component. The component may be an electronic element using light or sound. For example, the electronic element may be a sensor receiving and using light, such as an infrared sensor, a camera receiving light to capture an image, a sensor outputting and sensing light or sound to measure a distance or recognize a fingerprint or the like, a small lamp outputting light, or a speaker outputting sound.

Hereinafter, an organic light-emitting display apparatus will be described as an example of the display apparatus DD manufactured according to some embodiments, but the present disclosure is not limited thereto. According to some embodiments, the display apparatus DD may be an inorganic light-emitting display apparatus (or an inorganic electroluminescent (EL) display apparatus), a quantum dot light-emitting display apparatus, or the like. For example, an emission layer of a display element included in the display apparatus DD may include an organic material, an inorganic material, quantum dots, an organic material and quantum dots, or an inorganic material and quantum dots.

Figure 2:
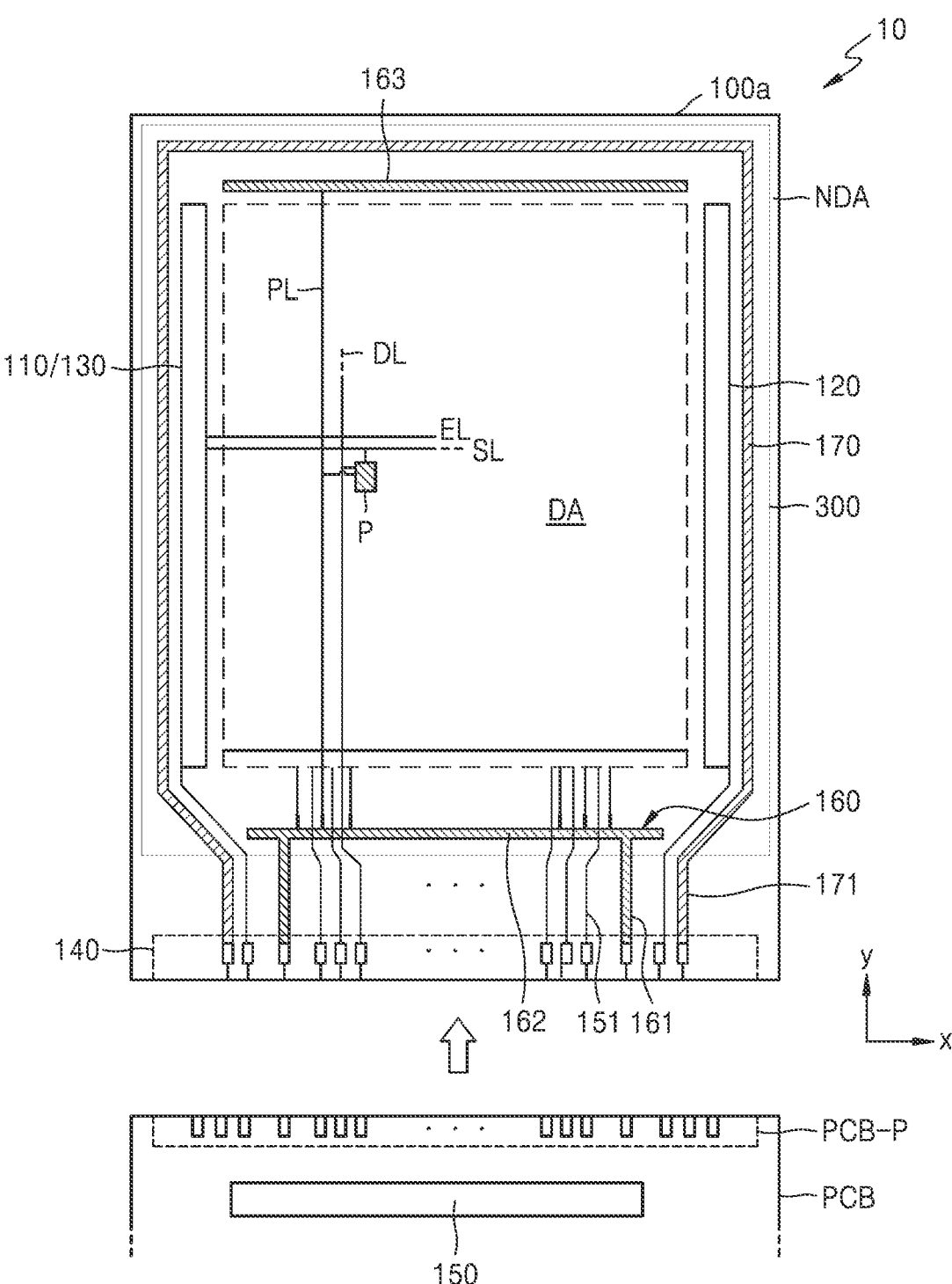
FIG. 2 is a plan view schematically illustrating a display panel included in the display apparatus of FIG. 1.

FIG. 2 is a plan view schematically illustrating a display panel 10 included in the display apparatus DD of FIG. 1.

Referring to FIG. 2, the display apparatus DD (see FIG. 1) includes the display panel 10. The display panel 10 includes a substrate 100a including a display area DA in which a plurality of pixels P is arranged and a non-display area NDA surrounding at least a portion of the display area DA. Although a single pixel P is illustrated in FIG. 1 for convenience of illustration, a person having ordinary skill in the art would appreciate that the number of pixels P may vary according to the design of the display panel 10.

A plurality of pixels P are arranged in the display area DA. The plurality of pixels P may each include a display element such as an organic light-emitting diode (OLED). Each pixel P may emit red, green, blue, or white light through the display element.

External circuits respectively electrically connected to the plurality of pixels P may be arranged in the non-display area NDA. For example, first and second scan driving circuits 110 and 120, an emission control driving circuit 130, a terminal portion 140, a first power supply line 160, and a second power supply line 170 may be arranged in the non-display area NDA.

The first scan driving circuit 110 and the second scan driving circuit 120 may provide a scan signal to each pixel P through a scan line SL. The first scan driving circuit 110 and the second scan driving circuit 120 may be arranged on both sides of the display area DA arranged therebetween. Some of the pixels P arranged in the display area DA may be electrically connected to the first scan driving circuit 110 arranged on a left side of the display area DA, and the remaining pixels P may be connected to the second scan driving circuit 120 arranged on a right side of the display area DA. The emission control driving circuit 130 that applies an emission control signal to each pixel P through an emission control line EL may be arranged adjacent to the first scan driving circuit 110 on one side of the display area DA. According to some embodiments, the first scan driving circuit 110 and the second scan driving circuit 120 may be arranged on one side of the display area DA.

The terminal portion 140 may be arranged on one side of the substrate 100a. A terminal of the terminal portion 140 may be exposed without being covered by an insulating layer, and may be electrically connected to a printed circuit board PCB. A terminal PCB-P of the printed circuit board PCB may be electrically connected to the terminal of the terminal portion 140 of the display panel 10. The printed circuit board PCB transmits a signal or power from a controller to the display panel 10.

The controller may provide a first power voltage ELVDD (see FIG. 3) to the first power supply line 160 through a first connection wire 161, and may provide a second power voltage ELVSS (see FIG. 3) to the second power supply line 170 through a second connection wire 171. The first power voltage ELVDD may be provided to each pixel P through a driving voltage line PL connected to the first power supply line 160, and the second power voltage ELVSS may be provided to an opposite electrode 230 (see FIG. 4) of each pixel P connected to the second power supply line 170.

The first power supply line 160 may include a first sub-line 162 and a second sub-line 163 that extend in parallel with each other in an x-direction with the display area DA therebetween. The second power supply line 170 may have a loop shape having an open side, and may partially surround the display area DA.

The data driving circuit 150 is electrically connected to a data line DL. A data signal of the data driving circuit 150 may be provided to each pixel P through a connection wire 151 connecting the terminal portion 140 to the data line DL. Although FIG. 2 illustrates that the data driving circuit 150 is located on the printed circuit board PCB, the data driving circuit 150 may be located on the substrate 100a. For example, the data driving circuit 150 may be arranged between the terminal portion 140 and the first power supply line 160.

Figure 3:
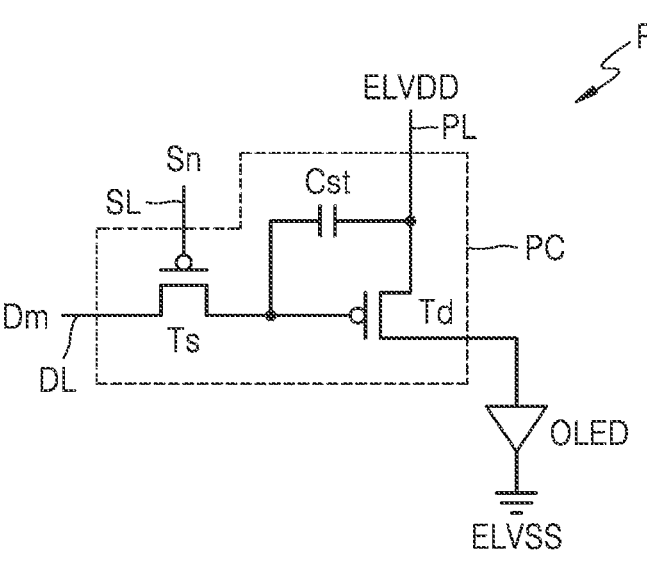
FIG. 3 is an equivalent circuit diagram of a pixel included in the display apparatus of FIG. 1.

FIG. 3 is an equivalent circuit diagram of the pixel P included in the display apparatus DD of FIG. 1.

Referring to FIG. 3, each pixel P includes a pixel circuit PC connected to the scan line SL and the data line DL, and a display element OLED connected to the pixel circuit PC.

The pixel circuit PC includes a driving thin-film transistor Td, a switching thin-film transistor Ts, and a storage capacitor Cst. The switching thin-film transistor Ts is connected to the scan line SL and the data line DL, and transmits a data signal Dm input through the data line DL to the driving thin-film transistor Td according to a scan signal Sn input through the scan line SL.

The storage capacitor Cst is connected to the switching thin-film transistor Ts and the driving voltage line PL, and stores a voltage corresponding to a difference between a voltage received from the switching thin-film transistor Ts and the first power voltage ELVDD (or driving voltage) supplied to the driving voltage line PL.

The driving thin-film transistor Td is connected to the driving voltage line PL and the storage capacitor Cst, and may control a driving current flowing from the driving voltage line PL to the display element OLED in response to a voltage value stored in the storage capacitor Cst. The display element OLED may emit light having a certain luminance according to the driving current.

Although FIG. 3 illustrates a case where the pixel circuit PC includes two thin-film transistors and one storage capacitor, but embodiments according to the present disclosure are not limited thereto. According to some embodiments, the pixel circuit PC may include, for example, seven thin-film transistors and one storage capacitor. According to some embodiments, the pixel circuit PC may include two or more storage capacitors. As described above, the numbers of thin-film transistors and storage capacitors and the circuit design thereof may be variously changed.

Figure 4:
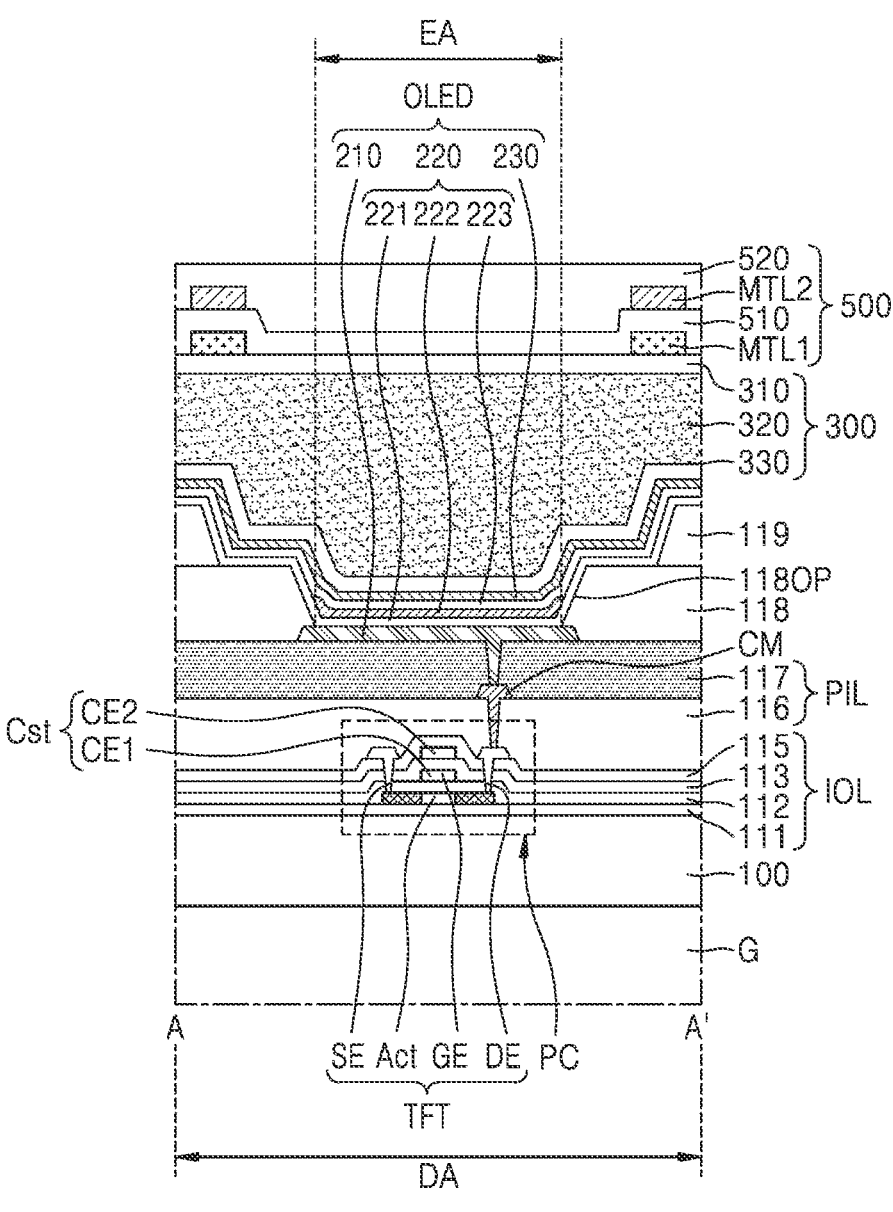
FIG. 4 is a cross-sectional view illustrating a partial region of an array substrate for a display apparatus according to an embodiment.
Figure 5:
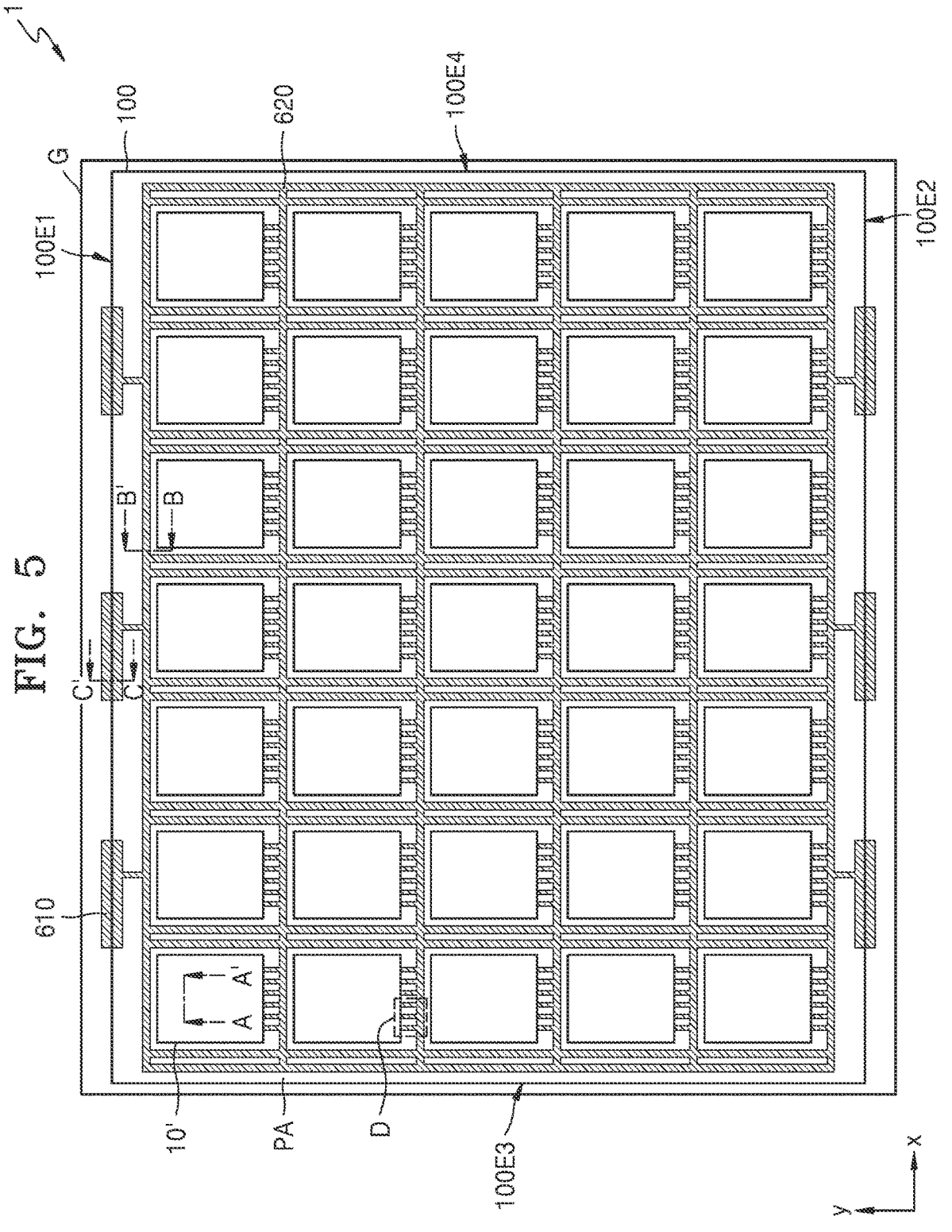
FIG. 5 is a plan view schematically illustrating an array substrate for a display apparatus according to an embodiment.
Figure 6:
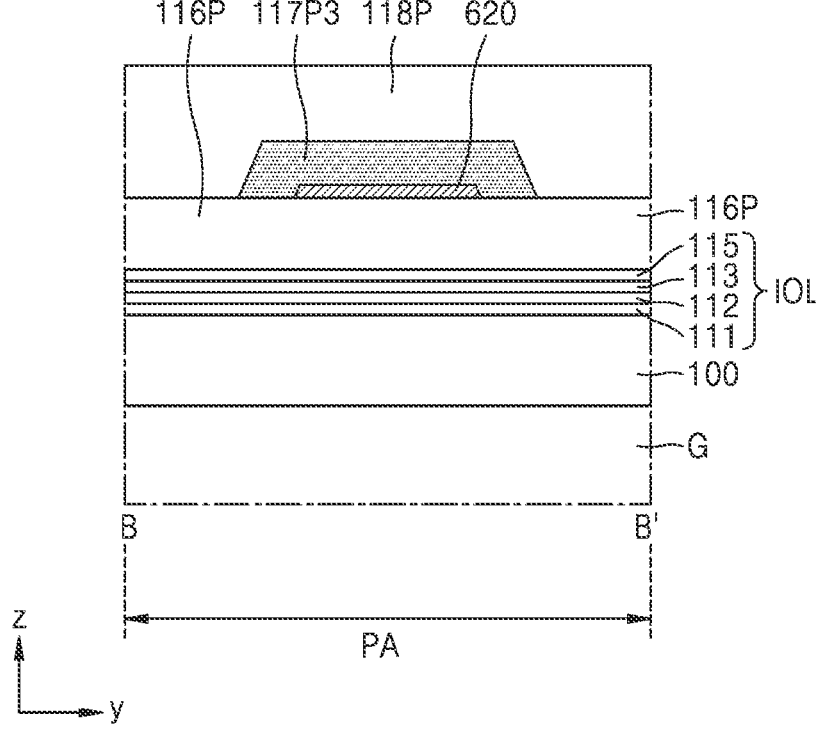
FIG. 6 is a cross-sectional view of the array substrate of FIG. 5, taken along the line B-B'.
Figure 7:
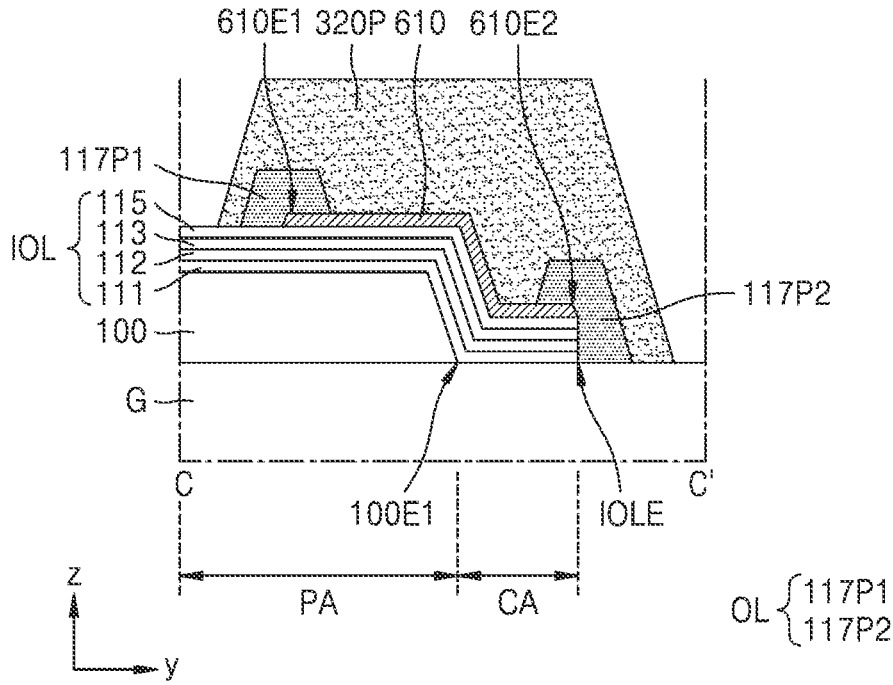
FIGS. 7 and 8 are cross-sectional views of the array substrate of FIG. 5, taken along the line C-C'.
Figure 8:
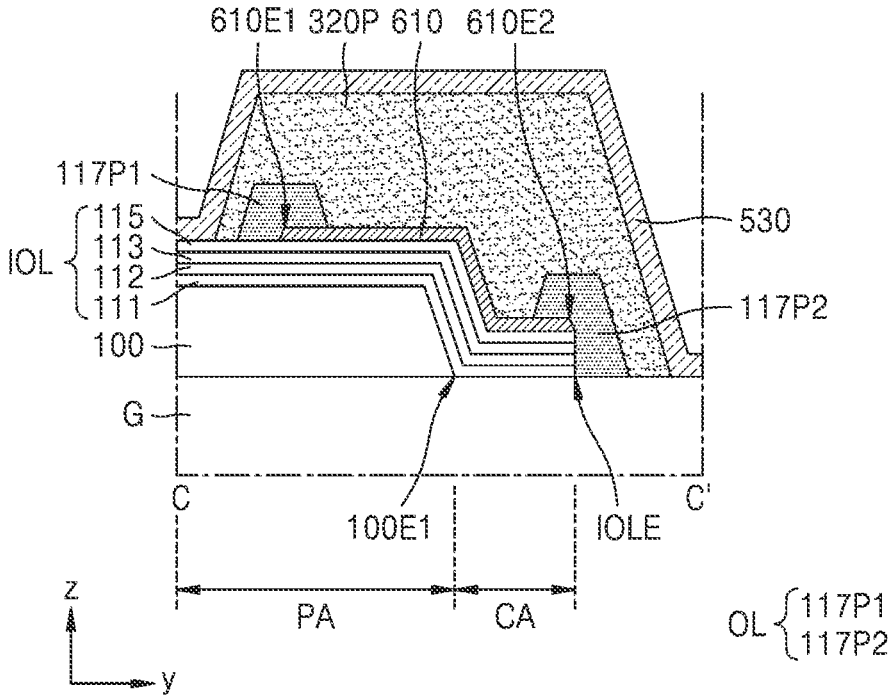

FIG. 4 is a cross-sectional view illustrating a partial region of an array substrate 1 for a display apparatus according to some embodiments, and FIG. 5 is a plan view schematically illustrating the array substrate 1 for a display apparatus according to some embodiments. FIG. 4 may be understood as a schematic cross-sectional view of the array substrate 1 for a display apparatus of FIG. 5, taken along the line A-A'. FIG. 6 is a cross-sectional view of the array substrate 1 of FIG. 5, taken along the line B-B', and FIGS. 7 and 8 are cross-sectional views of the array substrate 1 of FIG. 5, taken along the line C-C'.

First, referring to FIG. 5, the array substrate 1 for a display apparatus may include a mother substrate G and a base substrate 100 located on the mother substrate G.

The mother substrate G supports an upper structure in a manufacturing process, and may be formed of, for example, glass.

The base substrate 100 may be formed of a flexible material. For example, the base substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

Various modifications may be made to the base substrate 100. For example, the base substrate 100 may have a multi-layer structure including two layers each including the polymer resin and a barrier layer arranged between the two layers and including an inorganic material (e.g., silicon oxide, silicon nitride, silicon oxynitride, amorphous silicon, etc.).

The base substrate 100 may include a plurality of display cells 10' and a peripheral area PA surrounding the display cells 10'. The display cells 10' may be apart from each other in a first direction (e.g., an x-direction) and a second direction (e.g., an y-direction) to form an array. The display cells 10' each correspond to the display panel 10 shown in FIG. 2, and may each include the display area DA in which the plurality of pixels P are arranged and the non-display area NDA surrounding the display area DA. Each display cell 10' may be separated from the base substrate 100 through a scribing process to implement the display panel 10.

Referring to FIG. 4, the display element OLED and the pixel circuit PC electrically connected to the display element OLED may be arranged in the display area DA.

A buffer layer 111 may be located on the base substrate 100. The buffer layer 111 may prevent or reduce instances of impurities entering various devices located on the base substrate 100 through the base substrate 100.

The pixel circuit PC including a thin-film transistor TFT and the storage capacitor Cst may be located on the buffer layer 111. The thin-film transistor TFT may include a semiconductor layer Act, a gate electrode GE overlapping a channel area of the semiconductor layer Act, and a source electrode SE and a drain electrode DE respectively connected to a source area and a drain area of the semiconductor layer Act. In some embodiments, the semiconductor layers Act of an adjacent pair of the thin-film transistors TFT may be connected to each other to function as the source electrode SE and/or the drain electrode DE. A first gate insulating layer 112 may be arranged between the semiconductor layer Act and the gate electrode GE, and a second gate insulating layer 113 and an interlayer insulating layer 115 may be arranged between the gate electrode GE and the source electrode SE, and between the gate electrode GE and the drain electrode DE.

The storage capacitor Cst may be arranged to overlap the thin-film transistor TFT. The storage capacitor Cst may include a first capacitor plate CE1 and a second capacitor plate CE2 overlapping each other. According to some embodiments, the gate electrode GE of the thin-film transistor TFT may be integrally provided with the first capacitor plate CE1 of the storage capacitor Cst. The second gate insulating layer 113 may be arranged between the first capacitor plate CE1 and the second capacitor plate CE2. According to some embodiments, the first capacitor plate CE1 may be provided separately from the gate electrode GE of the thin-film transistor TFT.

The semiconductor layer Act may include a channel area, a source area, and a drain area, the source area and the drain area being doped with a large amount of impurities. According to some embodiments, the semiconductor layer Act may include a silicon semiconductor material. For example, the semiconductor layer Act may include polysilicon or amorphous silicon.

According to some embodiments, the semiconductor layer Act may include an oxide semiconductor material. In some embodiments, the pixel circuit PC may include a plurality of thin-film transistors TFT, some of the plurality of thin-film transistors TFT may include a silicon semiconductor material, and the other thin-film transistors TFT may include an oxide semiconductor material. When the semiconductor layer Act includes an oxide semiconductor material, the semiconductor layer Act may include, for example, oxide of at least one material selected from the group including indium (In), gallium (Ga), tin (Sn), zirconium (Zr), hafnium (Hf), titanium (Tl), and zinc (Zn).

The first gate insulating layer 112 may include an inorganic insulating material such as silicon oxide ($SiO_X$), silicon oxynitride (SiON), or silicon nitride ($SiN_X$), and may have a single-layer or multi-layer structure including the above-described material.

The gate electrode GE or the first capacitor plate CE1 may include a low-resistance conductive material such as molybdenum (Mo), aluminum (AI), copper (Cu), and/or titanium (Ti), and may have a single-layer or multi-layer structure including the above-described material.

The second capacitor plate CE2 may include Al, chromium (Cr), Mo, Ti, tungsten (W), and/or Cu, and may have a single-layer or multi-layer structure including the above-described material.

The second gate insulating layer 113 and the interlayer insulating layer 115 may include an inorganic insulating material such as $SiO_X$, SiON, or $SiN_X$, and may have a single-layered or multi-layered structure including the above-described material.

The source electrode SE and the drain electrode DE may include Al, Mo, Ti, W, and/or Cu, and may have a single-layer or multi-layer structure including the above-described material. For example, the source electrode SE and the drain electrode DE may have a three-layer structure of Ti layer/Al layer/Ti layer.

A planarization insulating layer PIL may be located on the pixel circuit PC. The planarization insulating layer PIL may have a single-layer or multi-layer structure. In this regard, FIG. 4 illustrates that the planarization insulating layer PIL includes a first planarization insulating layer 116 and a second planarization insulating layer 117. The first planarization insulating layer 116 and/or the second planarization insulating layer 117 may have an upper surface that is planarized through chemical mechanical polishing.

The first planarization insulating layer 116 and/or the second planarization insulating layer 117 may include an organic insulating material such as a general-purpose polymer (e.g., photosensitive polyimide, polyimide, polystyrene (PS), polycarbonate (PC), benzocyclobutene (BCB), hexamethyldisiloxane (HMDSO), or polymethylmethacrylate (PMMA)), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer.

A contact metal CM electrically connecting the display element OLED to the pixel circuit PC may be located on the first planarization insulating layer 116. For example, the contact metal CM may be electrically connected to the source electrode SE or the drain electrode DE of the thin-film transistor TFT through a contact hole penetrating the first planarization insulating layer 116. The contact metal CM may include Al, Mo, Ti, W, and/or Cu, and may have a single-layer or multi-layer structure including the above-described material. For example, the contact metal CM may have a three-layer structure of Ti layer/Al layer/Ti layer.

Signal lines such as the data line DL (see FIG. 2) may be arranged between the first planarization insulating layer 116 and the second planarization insulating layer 117.

A pixel electrode 210 may be located on the planarization insulating layer PIL. The pixel electrode 210 may include a reflective layer including silver (Ag), magnesium (Mg), Al, platinum (Pt), palladium (Pd), gold (Au), nickel (Ni), neodymium (Nd), iridium (Ir), Cr, or a compound thereof. The pixel electrode 210 may include a reflective layer including the above-described material, and a transparent conductive layer located above or/and below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may have a three-layer structure of ITO layer/Ag layer/ITO layer that are sequentially stacked.

A pixel-defining layer 118 may cover an edge of the pixel electrode 210, and may include an opening 118OP exposing a center of the pixel electrode 210. The pixel-defining layer 118 may include an organic insulating material such as BCB, polyimide, or HMDSO. An emission area EA may be defined through the opening 118OP of the pixel-defining layer 118, and red, green, or blue light may be emitted through the emission area EA. An area or width of the emission area EA may define an area or width of a pixel.

The pixel-defining layer 118 may be provided in black. The pixel-defining layer 118 may include a light-blocking material, and may be provided in black. The light-blocking material may include carbon black, carbon nanotubes, a resin or paste including black dye, metal particles (e.g., Ni, Al, Mo, and an alloy thereof), metal oxide particles (e.g., chromium oxide), or metal nitride particles (e.g., chromium nitride). When the pixel-defining layer 118 includes a light-blocking material, external reflection by metal structures located under the pixel-defining layer 118 may be reduced.

A spacer 119 may be formed on the pixel-defining layer 118. The spacer 119 may prevent or reduce instances of damage to below the spacer 119 due to a mask in a process of forming an intermediate layer 220, which is described below. According to some embodiments, the spacer 119 may include the same material as the pixel-defining layer 118, or may include a different material from the pixel-defining layer 118. For example, when the spacer 119 includes the same material as the pixel-defining layer 118, the spacer 119 and the pixel-defining layer 118 may be integrally formed through a half-tone mask. When the pixel-defining layer 118 is provided in black, the spacer 119 may also be provided in black.

The intermediate layer 220 may include an emission layer 222 overlapping the pixel electrode 210. The emission layer 222 may include an organic material. The emission layer 222 may include a polymer organic material or a low-molecular weight organic material that emits light of a certain color. The emission layer 222 may be formed through a deposition process using a mask as described above.

A first functional layer 221 and a second functional layer 223 may be located below and/or above the emission layer 222, respectively. According to some embodiments, unlike the emission layer 222 being patterned and arranged for each pixel, the first functional layer 221 and the second functional layer 223 may be integrally provided over an entire surface of the display area DA.

The first functional layer 221 may include a single layer or multiple layers. For example, when the first functional layer 221 is formed of a polymer material, the first functional layer 221 may be a hole transport layer (HTL) having a single-layer structure, and may be formed of poly-(3,4-ethylene-dihydroxythiophene) (PEDOT) or polyaniline (PANI). When the first functional layer 221 is formed of a low-molecular weight material, the first functional layer 221 may include a hole injection layer (HIL) and an HTL.

The second functional layer 223 may be optionally arranged. For example, when the first functional layer 221 and the emission layer 222 are each formed of a polymer material, the second functional layer 223 may be formed. The second functional layer 223 may include a single layer or multiple layers. The second functional layer 223 may include an electron transport layer (ETL) and/or an electron injection layer (EIL). In some embodiments, at least one of the HIL, the HTL, the ETL, or the EIL may be omitted.

The HIL may serve to facilitate injection of holes, and may include at least one selected from the group including HATCN, copper phthalocyanine (CuPc), PEDOT, PANI, and N,N-dinaphthyl-N,N'-diphenylbenzidine (NPD), but embodiments according to the present disclosure are not limited thereto.

The HTL may include a triphenylamine derivative having high hole mobility and excellent stability, such as N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB), as a host of the HTL.

The ETL may serve to facilitate transport of electrons, may include at least one selected from the group including tris(8-hydroxyquinolino)aluminum (Alq$_3$), PBD, TAZ, spiro-PBD, BAlq, lithium quinolate (Liq), BMB-3T, PF-6P, TPBI, COT, and SAlq, but embodiments according to the present disclosure are not limited thereto.

The EIL may serve to facilitate injection of electrons, and may include Yb, Alq$_3$, PBD, TAZ, spiro-PBD, BAlq, or SAlq, but embodiments according to the present disclosure are not limited thereto.

The opposite electrode 230 may include a conductive material having a relatively low work function. For example, the opposite electrode 230 may include a (semi-)transparent layer including Ag, Mg, Al, Ni, Cr, lithium (Li), calcium (Ca), or an alloy thereof. Alternatively, the opposite electrode 230 may further include a layer including ITO, IZO, ZnO, or In$_2$O$_3$ on the (semi-)transparent layer including the above-described material. According to some embodiments, the opposite electrode 230 may include Ag and Mg.

A sequentially stacked structure of the pixel electrode 210, the intermediate layer 220, and the opposite electrode 230 may constitute a light-emitting diode.

According to some embodiments, a capping layer may be located on the display element OLED. The capping layer may improve emission efficiency of the display element OLED according to the principle of constructive interference. The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, or any combination thereof. The carbocyclic compound, the heterocyclic compound, and the amine group-containing compound may optionally be substituted with a substituent including oxygen (O), nitrogen (N), sulfur (S), selenium (Se), silicon (Si), fluorine (F), chlorine (Cl), bromine (Br), iodine (I), or any combination thereof.

An encapsulation layer 300 may be located on the display element OLED. According to some embodiments, the encapsulation layer 300 may include at least one inorganic encapsulation layer and at least one organic encapsulation layer. The encapsulation layer 300 may include first and second inorganic encapsulation layers 310 and 330 and an organic encapsulation layer 320 arranged therebetween.

The first and second inorganic encapsulation layers 310 and 330 may each include at least one inorganic insulating material. The inorganic insulating material may include aluminum oxide (Al$_2$O$_3$), titanium oxide (TiO$_2$), tantalum oxide (Ta$_2$O$_5$), hafnium oxide (HfO$_2$), ZnO, SiO$_X$, SiN$_X$, and/or SiON. The first and second inorganic encapsulation layers 310 and 330 may be formed through chemical vapor deposition.

The organic encapsulation layer 320 may include poly-ethylene terephthalate, polyethylene naphthalate, polycarbonate, polyimide, polyethylene sulfonate, polyoxymethylene, polyarylate, hexamethyldisiloxane, an acryl-based resin (e.g., polymethyl methacrylate, polyacrylic acid, etc.), or a combination thereof.

According to some embodiments, an input sensing layer 500 may be located directly on the encapsulation layer 300. According to some embodiments, an insulating layer may be further included between the encapsulation layer 300 and a first conductive layer MTL1 of the input sensing layer 500. In this regard, the insulating layer may include an inorganic insulating material such as SiO$_X$, SiN$_X$, or SiON. Alternatively, the insulating layer may include an organic insulating material. As described above, the encapsulation layer 300 may include the organic encapsulation layer 320 including a pigment, and thus may provide a flat base surface. Accordingly, even when components of the input sensing layer 500 are formed by a continuous process, a defective rate may be reduced.

The input sensing layer 500 may have a multi-layer structure. The input sensing layer 500 includes a sensing electrode, a signal line (trace line) connected to the sensing electrode, and at least one insulating layer. The input sensing layer 500 may sense an external input according to, for example, an electrostatic capacitive method. An operating method of the input sensing layer 500 is not particularly limited in the present disclosure. In some embodiments, the input sensing layer 500 may sense an external input according to an electromagnetic induction method or a pressure sensing method.

The input sensing layer 500 may include the first conductive layer MTL1, a first insulating layer 510, and a second conductive layer MTL2.

For example, each of the first conductive layer MTL1 and the second conductive layer MTL2 may have a single-layer structure or a stacked multi-layer structure. A conductive layer having a single-layer structure may include a metal layer or a transparent conductive layer. The metal layer may include Mo, Ag, Ti, Cu, Al, and an alloy thereof. The transparent conductive layer may include a transparent conductive oxide such as ITO, IZO, ZnO, or indium tin zinc oxide (ITZO). In addition, the transparent conductive layer may include a conductive polymer such as PEDOT, metal nanowires, graphene, or the like.

A conductive layer having a multi-layer structure may include a plurality of metal layers. The plurality of metal layers may have, for example, a three-layer structure of Ti/Al/Ti. The conductive layer having a multi-layer structure may include at least one metal layer and at least one transparent conductive layer.

Each of the first conductive layer MTL1 and the second conductive layer MTL2 includes a plurality of patterns. Hereinafter, it may be understood that the first conductive layer MTL1 includes first conductive patterns, and that the second conductive layer MTL2 includes second conductive patterns. The first conductive patterns and the second conductive patterns may form a sensing electrode.

The first conductive layer MTL1 and the second conductive layer MTL2 may be electrically connected to each other through a contact hole. According to some embodiments, the first conductive layer MTL1 and the second conductive layer MTL2 may have a mesh structure to allow light emitted by the display element OLED to pass therethrough. In this regard, the first conductive layer MTL1 and the second conductive layer MTL2 may be arranged so as not to overlap the emission area EA.

The first insulating layer 510 may have a single-layer or multi-layer structure. The first insulating layer 510 may include an inorganic material or a composite material. For example, the first insulating layer 510 may include an inorganic layer. The inorganic layer may include at least one of $Al_2O_3$, $TiO_2$, $SiO_X$, SiON, $SiN_X$, zirconium oxide ($ZrO_2$), or $HfO_2$. According to some embodiments, the first insulating layer 510 may be replaced by an organic insulating layer.

According to some embodiments, the input sensing layer 500 may further include a second insulating layer 520. The second insulating layer 520 may include an inorganic material or an organic material. The inorganic material may include at least one material selected from the group including $SiN_X$, aluminum nitride (AlN), zirconium nitride (ZrN), titanium nitride (TiN), hafnium nitride (HfN), tantalum nitride (TaN), $SiO_X$, $Al_2O_3$, $TiO_2$, tin oxide ($SnO_2$), cerium oxide ($CeO_2$), and SiON. The organic material may include at least one material selected from the group including an acryl-based resin, a methacryl-based resin, polyisoprene, a vinyl-based resin, an epoxy-based resin, an urethane-based resin, a cellulose-based resin, and a perylene-based resin.

As shown in FIG. 5, the array substrate 1 for a display apparatus may include a ground pad 610 and a ground wire 620. The ground wire 620 may be arranged in the peripheral area PA to surround each display cell 10'. The ground wire 620 may electrically connect each display cell 10' to the ground pad 610.

Referring to FIG. 6, at least one inorganic insulating layer IOL may be arranged in the peripheral area PA of the base substrate 100. In this regard, FIG. 6 illustrates that the inorganic insulating layer IOL arranged in the peripheral area PA includes the buffer layer 111, the first gate insulating layer 112, the second gate insulating layer 113, and the interlayer insulating layer 115. According to some embodiments, the inorganic insulating layer IOL arranged in the peripheral area PA may be formed by the same process as the corresponding inorganic insulating layer IOL arranged in the display area DA. For example, the buffer layer 111 arranged in the peripheral area PA may be formed by the same process as the buffer layer 111 arranged in the display area DA.

A lower organic layer 116P may be located on the inorganic insulating layer IOL. The lower organic layer 116P may be formed by the same process as the first planarization insulating layer 116 of the display area DA. For example, the lower organic layer 116P may be formed by extending the first planarization insulating layer 116 to the peripheral area PA. An end of the lower organic layer 116P may be arranged inside first to fourth edges 100E1, 100E2, 100E3, and 100E4 of the base substrate 100, and thus, the lower organic layer 116P may not overlap the ground pad 610.

The ground wire 620 is located on the lower organic layer 116P. The ground wire 620 may include the same material as the contact metal CM of the display area DA. As used herein, the expression "A and B include the same material" means that A and B are simultaneously formed through the same process. For example, the ground wire 620 may be simultaneously formed through the same process as the contact metal CM. The ground wire 620 may include Al, Mo, Ti, W, and/or Cu, and may have a single-layer or multi-layer structure including the above-described material. For example, the ground wire 620 may have a three-layer structure of Ti layer/Al layer/Ti layer.

A cover layer 117P3 completely covering the ground wire 620 may be located on the ground wire 620. For example, when viewed from a direction perpendicular to an upper surface of the base substrate 100, the ground wire 620 may be arranged inside the cover layer 117P3. The cover layer 117P3 may include the same material as the second planarization insulating layer 117 of the display area DA. For example, the cover layer 117P3 may be formed through the same process as the second planarization insulating layer 117.

An upper organic layer 118P may be located on the cover layer 117P3. The upper organic layer 118P may include the same material as the pixel-defining layer 118 of the display area DA. For example, the upper organic layer 118P may be formed through the same process as the pixel-defining layer 118. An end of the upper organic layer 118P may be arranged inside the first to fourth edges 100E1, 100E2, 100E3, and 100E4 of the base substrate 100, and thus, the upper organic layer 118P may not overlap the ground pad 610.

The cover layer 117P3 and the upper organic layer 118P may completely cover upper and side surfaces of the ground wire 620, and thus, instances of metal materials included in the ground wire 620 reacting and forming particles in a process of forming the pixel electrode 210 of the display area DA may be prevented or reduced.

The ground pad 610 may be arranged to overlap the first edge 100E1 and the second edge 100E2 of the base substrate 100. According to some embodiments, a plurality of ground pads 610 may be provided, and each ground pad 610 may be arranged to overlap at least one of the first edge 100E1, the second edge 100E2, the third edge 100E3, or the fourth edge 100E4. According to some embodiments, as shown in FIG. 5, a plurality of ground pads 610 may be provided, and the ground pads 610 may be arranged apart from each other in the first direction (e.g., the x-direction) along the first edge 100E1 and/or the second edge 100E2 of the base substrate 100. According to some embodiments, the ground pad 610 may be provided as a single body extending in the first direction (e.g., the x-direction) along the first edge 100E1 and/or the second edge 100E2 of the base substrate 100.

Referring to FIG. 7, an end IOLE of the inorganic insulating layer IOL may be arranged outside the first edge 100E1 of the base substrate 100. For example, at least one inorganic insulating layer IOL may extend from the upper surface of the base substrate 100 to an outermost portion of the mother substrate G beyond the first edge 100E1. The inorganic insulating layer IOL thus extending may be in direct contact with an upper surface of the mother substrate G to form a contact area CA. In this regard, FIG. 7 illustrates that the inorganic insulating layer IOL extending from the upper surface of the base substrate 100 to the outermost portion of the mother substrate G includes the buffer layer 111, the first gate insulating layer 112, the second gate insulating layer 113, and the interlayer insulating layer 115, but embodiments according to the present disclosure are not limited thereto. For example, an end of the buffer layer 111 and an end of the first gate insulating layer 112 may not coincide with each other, and some inorganic insulating layers IOL may not extend to an outermost portion of the base substrate 100. The inorganic insulating layer IOL extending to the mother substrate G may be in direct contact with the mother substrate G and cover the base substrate 100 to prevent or reduce penetration of impurities into the base substrate 100, and to prevent or reduce instances of the base substrate 100 being lifted from the mother substrate G.

The ground pad 610 may be located on the inorganic insulating layer IOL. As described above, the ground pad 610 may be arranged to overlap the first edge 100E1 of the base substrate 100. For example, when viewed from the direction perpendicular to the upper surface of the base substrate 100, the ground pad 610 may be arranged to extend between the base substrate 100 and the mother substrate G at the outermost portion of the base substrate 100.

The ground pad 610 may include the same material as the contact metal CM of the display area DA. For example, the ground pad 610 may be simultaneously formed through the same process as the contact metal CM. The ground pad 610 may include Al, Mo, Ti, W, and/or Cu, and may have a single-layer or multi-layer structure including the above-described material. For example, the ground pad 610 may have a three-layer structure of Ti layer/Al layer/Ti layer.

A first organic layer OL may be arranged to cover an edge of the ground pad 610. In this regard, FIG. 7 illustrates that a 1-1 st organic layer 117P1 is arranged to overlap a first edge 610E1 of the ground pad 610, and that a 1-2nd organic layer 117P2 is arranged to overlap a second edge 610E2 of the ground pad 610. The first organic layer OL may include the same material as the second planarization insulating layer 117 of the display area DA. For example, the first organic layer OL may be simultaneously formed through the same process as the second planarization insulating layer 117.

The 1-2nd organic layer 117P2 may overlap the second edge 610E2 of the ground pad 610 and the end IOLE of the inorganic insulating layer IOL. For example, the 1-2nd organic layer 117P2 may be in direct contact with the upper surface of the mother substrate G beyond the end IOLE of the inorganic insulating layer IOL. The 1-1st organic layer 117P1 and the 1-2nd organic layer 117P2 may extend along the edge of the ground pad 610 to be provided as a single body. For example, the first organic layer OL may have a closed loop shape having an opening exposing a central area of the ground pad 610.

The first organic layer OL may cover the edge of the ground pad 610 to prevent or reduce instances of metal materials included in the ground pad 610 reacting in the process of forming the pixel electrode 210 of the display area DA to form particles at the edge of the ground pad 610.

The ground pad 610 may be in direct contact with a holder on which the array substrate 1 for a display apparatus is mounted in a process using a fine metal mask. Accordingly, in the process using the fine metal mask, charges charged to the array substrate 1 for a display apparatus may be discharged through the ground pad 610 and the holder.

A second organic layer 320P may be formed on the first organic layer OL. When viewed from the direction perpendicular to the upper surface of the base substrate 100, the second organic layer 320P may overlap the ground pad 610. The second organic layer 320P may completely cover an exposed upper surface of the ground pad 610. According to some embodiments, as shown in FIG. 7, the second organic layer 320P may be arranged to cover the ground pad 610 and the first organic layer OL. For example, the second organic layer 320P may extend from the base substrate 100 to the outermost portion of the mother substrate G beyond the first edge 100E1 of the base substrate 100. According to some embodiments, the second organic layer 320P may include the same material as the organic encapsulation layer 320 of the display area DA. For example, the second organic layer 320P may be simultaneously formed through the same process as the organic encapsulation layer 320.

In an ashing process of removing a photoresist layer after forming the second inorganic encapsulation layer 330 of the encapsulation layer 300, the second organic layer 320P may prevent or reduce the occurrence of defects due to charges being charged to the ground pad 610.

According to some embodiments, as shown in FIG. 8, a metal layer 530 may be located on the second organic layer 320P. The metal layer 530 may be arranged to overlap the second organic layer 320P, one end of the metal layer 530 may be in contact with an upper surface of the inorganic insulating layer IOL, and the other end of the metal layer 530 may be in contact with the upper surface of the mother substrate G. The metal layer 530 may be in direct contact with the upper surfaces of the inorganic insulating layer IOL and the mother substrate G to prevent or reduce lifting of the second organic layer 320P, which is an organic layer.

FIGS. 9 to 12 are cross-sectional views illustrating a method of manufacturing a display apparatus in stages, according to some embodiments.

Figure 9:
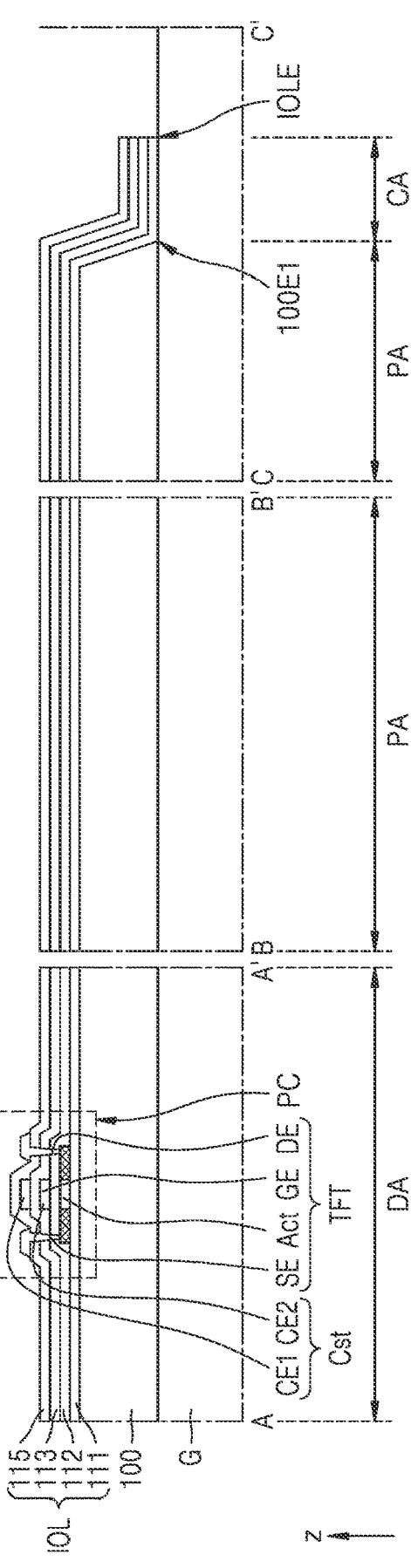

Referring to FIG. 9, the base substrate 100 may be formed on the mother substrate G. As described above, the base substrate 100 may have a multi-layer structure in which a plurality of organic material layers and a plurality of inorganic material layers are alternately stacked. The base substrate 100 may include the plurality of display cells 10' (see FIG. 5) and the peripheral area PA surrounding the display cells 10', the display cells 10' each including the display area DA in which the display element OLED is arranged and the non-display area NDA (see FIG. 5) surrounding the display area DA.

The inorganic insulating layer IOL and the pixel circuit PC may be formed on the base substrate 100. According to some embodiments, the pixel circuit PC may be formed in the display area DA. The pixel circuit PC may include the thin-film transistor TFT and the storage capacitor Cst. The inorganic insulating layer IOL including the buffer layer 111, the first gate insulating layer 112, the second gate insulating layer 113, and the interlayer insulating layer 115 may be formed in the display area DA and in the peripheral area PA. At least one layer of the inorganic insulating layer IOL may be formed to extend beyond the first edge 100E1 of the base substrate 100 to the outermost portion of the mother substrate G. For example, the end IOLE of the inorganic insulating layer IOL may be arranged between the first edge 100E1 of the base substrate 100 and an end of the mother substrate G. The inorganic insulating layer IOL may form the contact area CA in direct contact with the upper surface of the mother substrate G.

Figure 10:
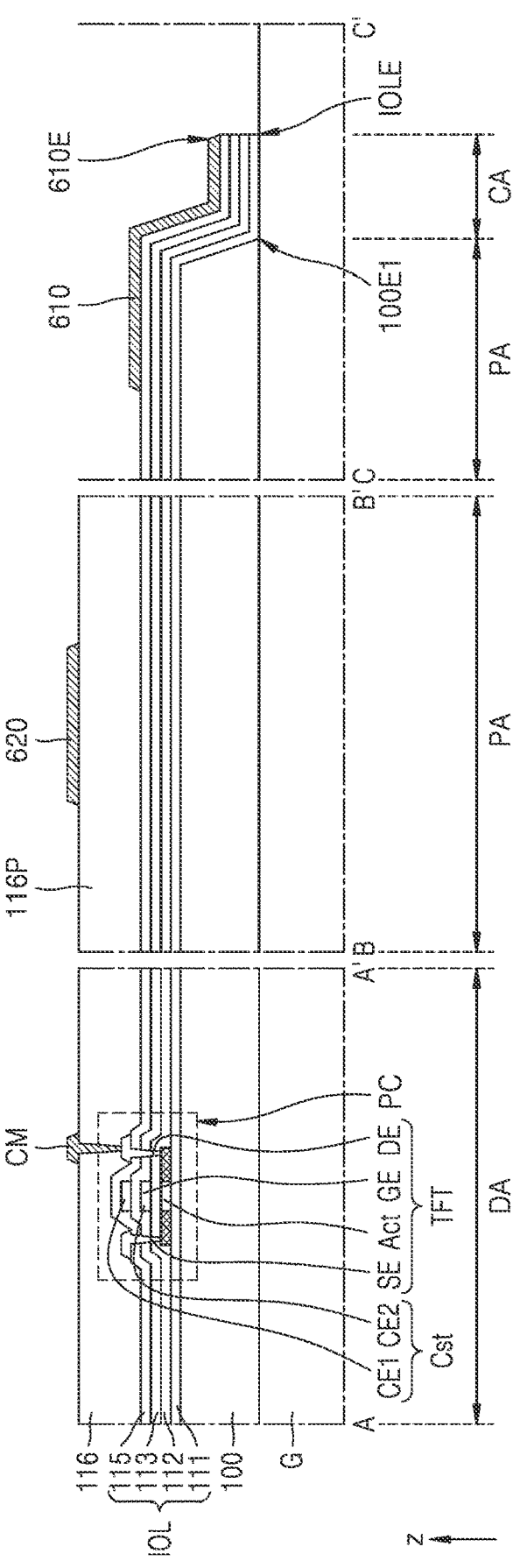

Referring to FIG. 10, the first planarization insulating layer 116 is formed in the display area DA, and the lower organic layer 116P is formed in a portion of the peripheral area PA. The first planarization insulating layer 116 and the lower organic layer 116P may be simultaneously formed by the same process. For example, the lower organic layer 116P may be formed by extending the first planarization insulating layer 116 to the peripheral area PA. The lower organic layer 116P may not extend to an outermost portion of the peripheral area PA. Accordingly, the upper surface of the inorganic insulating layer IOL may be exposed in a portion of the peripheral area PA adjacent to the first edge 100E1 of the base substrate 100.

The contact metal CM is formed in the display area DA, and the ground pad 610 and the ground wire 620 are formed in the peripheral area PA. The contact metal CM may be formed on the first planarization insulating layer 116, and may be electrically connected to the source electrode SE or the drain electrode DE of the thin-film transistor TFT through a contact hole penetrating the first planarization insulating layer 116. The ground wire 620 may be formed on the lower organic layer 116P. When viewed from the direction perpendicular to the upper surface of the base substrate 100, the ground pad 610 may be formed on the inorganic insulating layer IOL to overlap the first edge 100E1 of the base substrate 100. For example, the ground pad 610 may be formed such that a portion of the ground pad 610 overlaps the base substrate 100 at the outermost portion of the base substrate 100, and the remaining portion of the ground pad 610 overlaps the mother substrate G.

In this regard, FIG. 10 illustrates that the edge 610E of the ground pad 610 may overlap the end IOLE of the inorganic insulating layer IOL. The edge 610E may be inside the end IOLE of the inorganic insulating layer IOL. Although FIGS. 9 to 12 illustrate that the ground pad 610 is formed on a side of the first edge 100E1 of the base substrate 100, as described above, the ground pad 610 may be formed on a side of another edge of the base substrate 100.

The ground pad 610 and the ground wire 620 may include the same material as the contact metal CM. For example, the ground pad 610 and the ground wire 620 may be simultaneously formed through the same process as the contact metal CM. The contact metal CM, the ground pad 610, and the ground wire 620 may include Al, Mo, Ti, W, and/or Cu, and may have a single-layer or multi-layer structure including the above-described material. For example, the contact metal CM, the ground pad 610, and the ground wire 620 may have a three-layer structure of Ti layer/Al layer/Ti layer.

Figure 11:
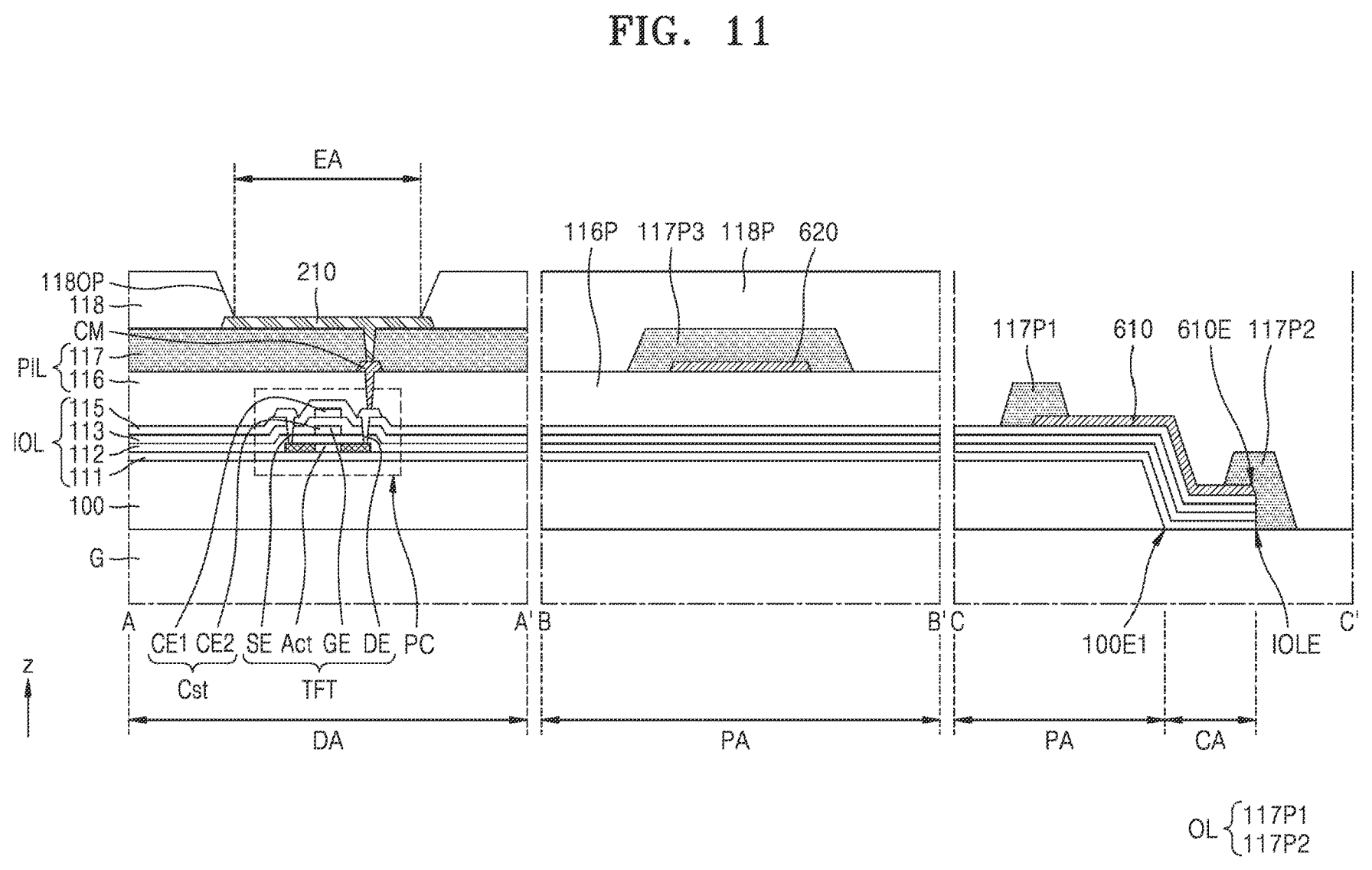

Referring to FIG. 11, the second planarization insulating layer 117 is formed in the display area DA, and the cover layer 117P3 and the first organic layer OL are formed in the peripheral area PA. When viewed from the direction perpendicular to the upper surface of the base substrate 100, the cover layer 117P3 may be formed to overlap the ground wire 620. The cover layer 117P3 may be formed to completely cover the upper and side surfaces of the ground wire 620.

The first organic layer OL includes the 1-1st organic layer 117P1 covering the edge of the ground pad 610 on the base substrate 100 and the 1-2nd organic layer 117P2 covering the edge of the ground pad 610 outside the first edge 100E1 of the base substrate 100. The 1-1st organic layer 117P1 and the 1-2nd organic layer 117P2 may extend along the edge of the ground pad 610 to be formed as a single body. For example, the 1-1st organic layer 117P1 and the 1-2nd organic layer 117P2 may form a closed loop shape having an opening exposing a central area of the ground pad 610.

The cover layer 117P3, the 1-1st organic layer 117P1, and the 1-2nd organic layer 117P2 may include the same material as the second planarization insulating layer 117. For example, the cover layer 117P3, the 1-1st organic layer 117P1, and the 1-2nd organic layer 117P2 may be simultaneously formed through the same process as the second planarization insulating layer 117.

The pixel electrode 210 is formed on the second planarization insulating layer 117. The pixel electrode 210 may be electrically connected to the contact metal CM through a contact hole penetrating the second planarization insulating layer 117. The pixel-defining layer 118 covering the edge of the pixel electrode 210 and including the opening 118OP exposing the center of the pixel electrode 210 may be formed on the pixel electrode 210, and the upper organic layer 118P may be formed on the cover layer 117P3. The upper organic layer 118P may include the same material as the pixel-defining layer 118. For example, the upper organic layer 118P may be simultaneously formed through the same process as the pixel-defining layer 118.

Figure 12:
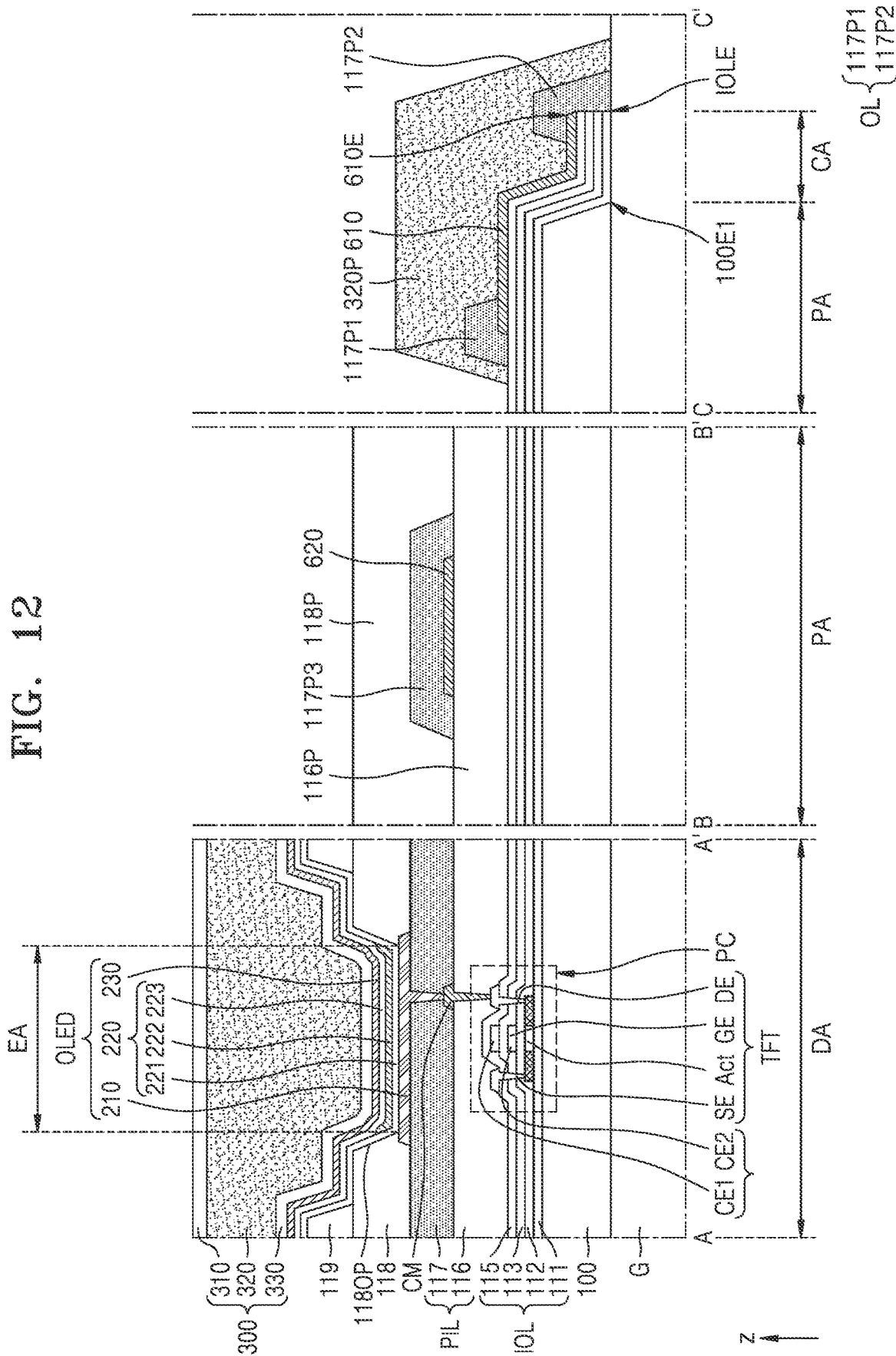

Referring to FIG. 12, the intermediate layer 220 and the opposite electrode 230 are sequentially formed in the display area DA. The intermediate layer 220 may include the first functional layer 221, the emission layer 222, and the second functional layer 223. According to some embodiments, the first functional layer 221 or the second functional layer 223 may be omitted. The emission layer 222 may be formed to correspond to the pixel electrode 210. The emission layer 222 may be formed by chemical vapor deposition using a fine metal mask. In this regard, to align the fine metal mask with the array substrate 1 for a display apparatus, the array substrate 1 for a display apparatus may be mounted on a holder of a deposition apparatus. The holder may be in direct contact with the exposed upper surface of the ground pad 610, and charges charged to the array substrate 1 for a display apparatus by the fine metal mask may be discharged to the deposition apparatus through the ground wire 620 and the ground pad 610.

The encapsulation layer 300 may be formed on the opposite electrode 230. The encapsulation layer 300 may include at least one inorganic encapsulation layer and at least one organic encapsulation layer. In this regard, FIG. 12 illustrates that the encapsulation layer 300 is formed by sequentially stacking the first inorganic encapsulation layer 310, the organic encapsulation layer 320, and the second inorganic encapsulation layer 330.

The organic encapsulation layer 320 may be formed by applying a monomer-based material and/or a polymer-based material. In this regard, the second organic layer 320P may be formed on the ground pad 610 through the same process as the organic encapsulation layer 320. When viewed from the direction perpendicular to the upper surface of the base substrate 100, the second organic layer 320P may be formed to overlap the ground pad 610. According to some embodiments, when viewed from the direction perpendicular to the upper surface of the base substrate 100, the second organic layer 320P may be formed to overlap the 1-1st organic layer 117P1 and the 1-2nd organic layer 117P2. For example, the second organic layer 320P may be formed to extend from the base substrate 100 to the outermost portion of the mother substrate G beyond the first edge 100E1 of the base substrate 100.

The second organic layer 320P may be formed before a deposition process of the second inorganic encapsulation layer 330, and thus, in an ashing process performed after the deposition process of the second inorganic encapsulation layer 330, occurrence of arching defects due to charges charged to the ground pad 610 may be prevented or reduced.

A subsequent process for forming the input sensing layer 500 (see FIG. 4), a polarizing film, a protective film, or the like on the encapsulation layer 300 may be performed. Thereafter, the display cell 10' (see FIG. 5) and the peripheral area PA may be separated along an edge of the display cell 10' (see FIG. 5) to form the display panel 10 (see FIG. 2).

Figure 13:
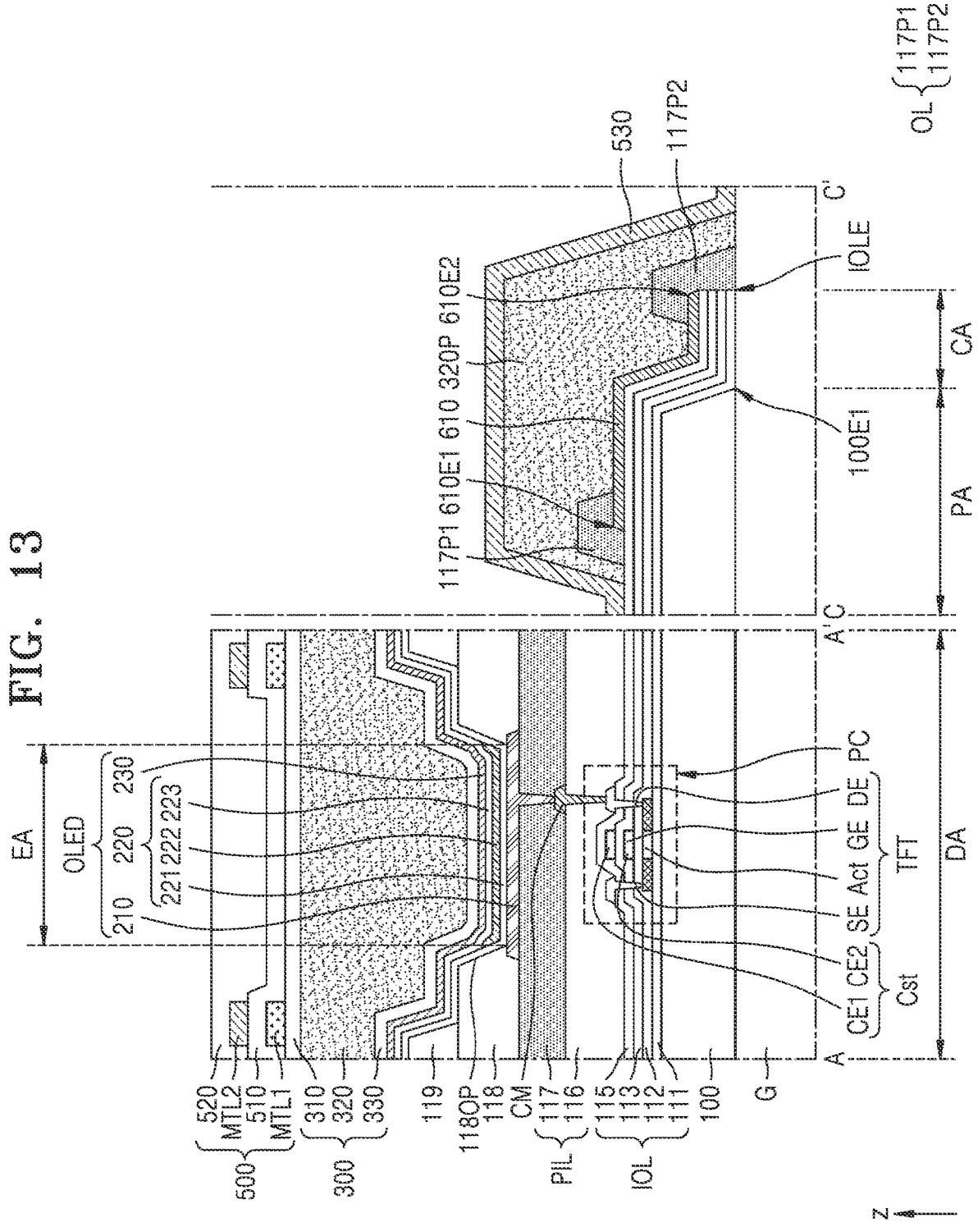
FIGS. 13 and 14 are cross-sectional views each illustrating an operation of a method of manufacturing a display apparatus, according to embodiments.
Figure 14:
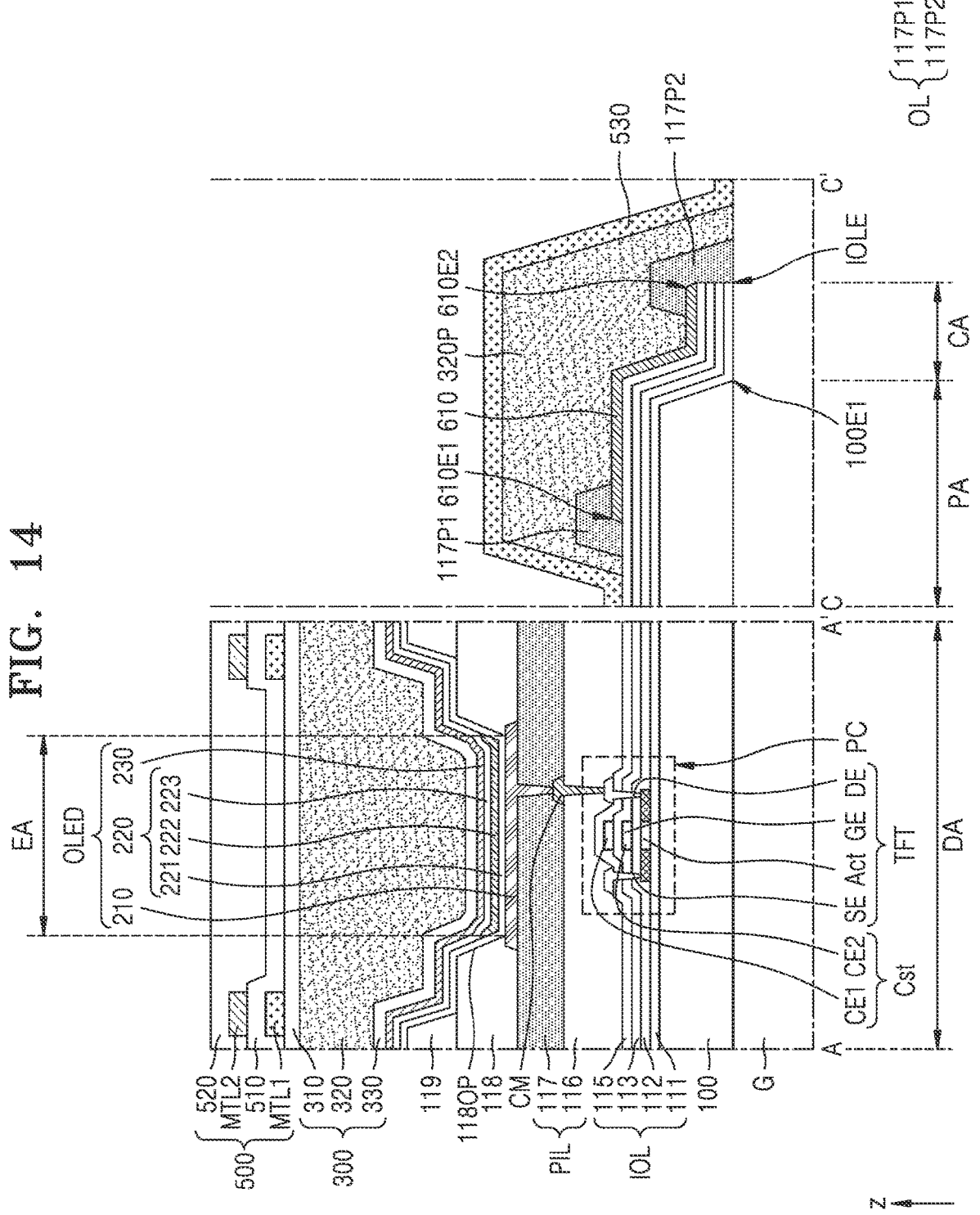

FIGS. 13 and 14 are cross-sectional views each illustrating an operation of a method of manufacturing a display apparatus, according to embodiments.

Referring to FIGS. 13 and 4, the input sensing layer 500 may be formed on the encapsulation layer 300, and the metal layer 530 may be formed on the second organic layer 320P.

The input sensing layer 500 may include the first conductive layer MTL1, the second conductive layer MTL2, and at least one insulating layer arranged between the first conductive layer MTL1 and the second conductive layer MTL2. In this regard, FIGS. 13 and 14 illustrates that the input sensing layer 500 includes the first insulating layer 510, the first conductive layer MTL1, the second insulating layer 520, and the second conductive layer MTL2 that are sequentially stacked.

When viewed from the direction perpendicular to the upper surface of the base substrate 100, the metal layer 530 may be formed to overlap the second organic layer 320P. One end of the metal layer 530 may be in direct contact with the upper surface of the inorganic insulating layer IOL, and the other end of the metal layer 530 may be in direct contact with the upper surface of the mother substrate G. Because an adhesive force between the metal layer 530 and the inorganic insulating layer IOL and an adhesive force between the metal layer 530 and the mother substrate G are greater than an adhesive force between the second organic layer 320P and the inorganic insulating layer IOL and an adhesive force between the second organic layer 320P and the mother substrate G, respectively, the metal layer 530 may prevent or reduce the lifting of the second organic layer 320P.

According to some embodiments, the metal layer 530 may include the same material as the second conductive layer MTL2 as shown in FIG. 13. For example, the metal layer 530 may be simultaneously formed through the same process as the second conductive layer MTL2. According to some embodiments, the metal layer 530 may include the same material as the first conductive layer MTL1 as shown in FIG. 14.

Figure 15:
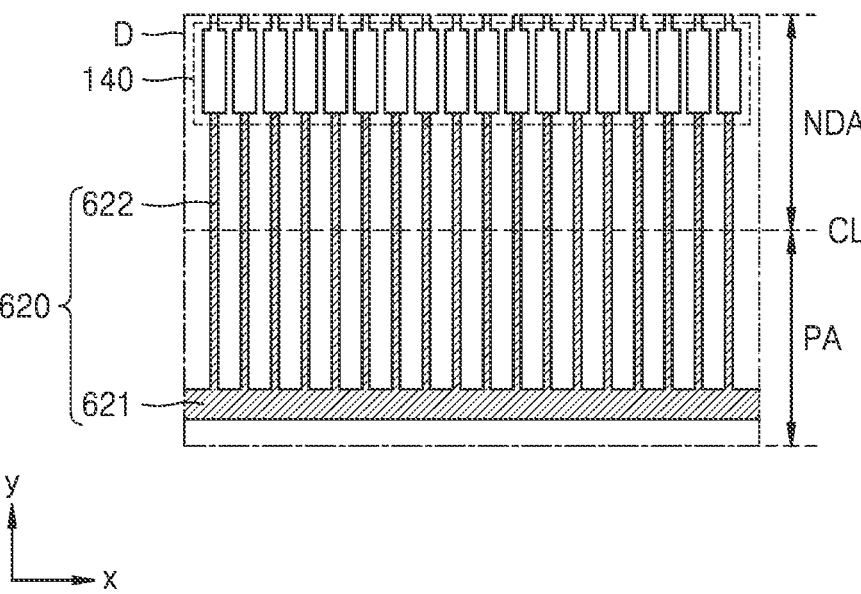
FIG. 15 is an enlarged view of region D of FIG. 5.

FIG. 15 is an enlarged view of region D of FIG. 5. For convenience of illustration, in FIG. 15 shows the terminal portion 140 and the ground wire 620, and other components are omitted.

Referring to FIG. 15, the terminal portion 140 arranged at one side of the non-display area NDA is electrically connected to the ground wire 620. For example, the ground wire 620 may include a first wire 621 extending in the first direction (e.g., the x-direction) and a second wire 622 extending in the second direction (e.g., the y-direction) crossing the first direction (e.g., the x-direction). The second wire 622 may extend from the first wire 621 to be connected to each terminal of the terminal portion 140. Accordingly, charges charged in the display cell 10' (see FIG. 5) may be discharged through the ground wire 620 connected to the terminal portion 140.

A portion of the second wire 622 of the ground wire 620 may be arranged in the non-display area NDA, and the remaining portion of the second wire 622 may be arranged in the peripheral area PA. A cutting line CL for separating the display cell 10' (see FIG. 5) from the peripheral area PA may correspond to a boundary between the non-display area NDA and the peripheral area PA, and the second wire 622 may be divided by the cutting line CL. Accordingly, When the display cell 10' (see FIG. 5) is separated from the peripheral area PA to form the display panel 10, portions of the first wire 621 and the second wire 622 may be removed, but the remaining portion of the second wire 622 may remain in the non-display area NDA of the display panel 10.

According to some embodiments as described above, an array substrate for a display apparatus may be capable of reducing pixel defects due to static electricity, and a method of manufacturing a display apparatus may be implemented. However, embodiments according to the present disclosure are not limited to these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. An array substrate for a display apparatus, the array substrate comprising:
   a mother substrate;
   a base substrate on the mother substrate and comprising a display cell and a peripheral area surrounding the display cell, the display cell comprising a display area and a non-display area surrounding the display area;
   a ground pad overlapping an edge of the base substrate and extending from an upper surface of the base substrate to overlap an upper surface of the mother substrate;
   a ground wire in the peripheral area to surround the display cell and electrically connected to the ground pad and the display cell;
   a first organic layer covering an edge of the ground pad; and
   a second organic layer on the first organic layer and covering the ground pad,
   wherein the second organic layer directly contacts the ground pad and the mother substrate.

2. The array substrate of claim 1, wherein the display cell comprises a terminal portion on one side of the non-display area, and
   the terminal portion is electrically connected to the ground pad through the ground wire.

3. The array substrate of claim 1, wherein the display cell comprises:
   a pixel circuit comprising a thin-film transistor and a storage capacitor;
   a display element in the display area and electrically connected to the pixel circuit; and
   a planarization insulating layer between the pixel circuit and the display element, and
   the first organic layer comprises a same material as the planarization insulating layer.

4. The array substrate of claim 3, wherein the display cell comprises an encapsulation layer on the display element and comprising at least one inorganic encapsulation layer and an organic encapsulation layer, and
   the second organic layer comprises a same material as the organic encapsulation layer.

5. The array substrate of claim 1, further comprising a metal layer covering the second organic layer.

6. The array substrate of claim 5, wherein the display cell comprises an input sensing layer in the display area, the input sensing layer comprises a first conductive layer, a second conductive layer, and an insulating layer between the first conductive layer and the second conductive layer, and the metal layer comprises a same material as the first conductive layer or the second conductive layer.

7. The array substrate of claim 1, further comprising a cover layer overlapping the ground wire.

8. The array substrate of claim 1, wherein a portion of the ground wire is in the non-display area.

9. The array substrate of claim 1, further comprising an inorganic insulating layer extending from the base substrate to the mother substrate, wherein the inorganic insulating layer is in direct contact with the mother substrate.

10. The array substrate of claim 9, wherein the ground pad is on the inorganic insulating layer.

11. The array substrate of claim 1, wherein the display cell comprises:

a pixel circuit comprising a thin-film transistor and a storage capacitor;

a display element in the display area and electrically connected to the pixel circuit; and a contact metal connecting the pixel circuit to the display element, and the ground pad comprises a same material as the contact metal.

12. A method of manufacturing a display apparatus, the method comprising:

forming, on a mother substrate, a base substrate comprising a display cell and a peripheral area surrounding the display cell, the display cell comprising a display area and a non-display area surrounding the display area;

forming a pixel circuit comprising a thin-film transistor and a storage capacitor on the base substrate;

forming a ground pad and a ground wire, the ground pad being arranged to overlap an edge of the base substrate, and the ground wire electrically connecting the ground pad to the pixel circuit;

forming a first organic layer and a cover layer, the first organic layer covering an edge of the ground pad, and the cover layer covering the ground wire;

forming a display element electrically connected to the pixel circuit in the display area;

forming a second organic layer to cover the ground pad, the second organic layer directly contacting the ground pad and the mother substrate; and separating the display cell from the peripheral area along an edge of the display cell.

13. The method of claim 12, wherein the forming of the display element comprises:

forming a pixel electrode;

forming an emission layer; and forming an opposite electrode, wherein, in the forming of the emission layer, the ground pad is in direct contact with a holder of deposition equipment.

14. The method of claim 12, wherein the forming of the first organic layer comprises forming a planarization insulating layer on the pixel circuit.

15. The method of claim 12, further comprising forming an inorganic encapsulation layer covering the display element between the forming of the display element and the forming of the second organic layer, wherein, the forming of the second organic layer comprises forming an organic encapsulation layer on the inorganic encapsulation layer.

16. The method of claim 12, further comprising forming a metal layer covering the second organic layer after the forming of the second organic layer.

17. The method of claim 16, wherein the display cell comprises an input sensing layer in the display area, the input sensing layer comprises a first conductive layer, a second conductive layer, and an insulating layer between the first conductive layer and the second conductive layer, and the first conductive layer is formed in the forming of the metal layer.

18. The method of claim 16, wherein the display cell comprises an input sensing layer in the display area, the input sensing layer comprises a first conductive layer, a second conductive layer, and an insulating layer between the first conductive layer and the second conductive layer, and the second conductive layer is formed in the forming of the metal layer.

19. The method of claim 12, wherein the display cell comprises a terminal portion on one side of the non-display area, and the terminal portion is electrically connected to the ground pad through the ground wire.

20. The method of claim 12, wherein, in the separating of the display cell from the peripheral area, a portion of the ground wire remains in the display cell.

\* \* \* \* \*